(12) United States Patent
Walker et al.

(10) Patent No.: US 6,310,720 B1
(45) Date of Patent: Oct. 30, 2001

(54) POLARIZATION INSENSITIVE SEMICONDUCTOR OPTICAL AMPLIFIER

(75) Inventors: Jeffrey D. Walker, El Cerrito; Sol P. Dijaili, Moraga; Richard P. Ratowsky, Castro Valley, all of CA (US)

(73) Assignee: Genoa Corporation, Fremont, CA (US)

( * ) Notice: Subject to any disclaimer, the term of this patent is extended or adjusted under 35 U.S.C. 154(b) by 0 days.

(21) Appl. No.: 09/585,587

(22) Filed: Jun. 2, 2000

(51) Int. Cl.$^7$ .................................................. H01S 3/00
(52) U.S. Cl. ................................... 359/344; 359/337
(58) Field of Search .................................. 359/337, 344

(56) References Cited

U.S. PATENT DOCUMENTS 5,223,972 * 6/1993 Nishimura et al. ................... 359/337
5,673,141 * 9/1997 Gambini .............................. 359/341

OTHER PUBLICATIONS

Application Note #1: Theory Of PDL Compensation; Taliescent Optimizing Optical Networks, Oct. 11, 1999; 10 pages.
Alcatel 1901 SOA, 1550 nm Conventional Semiconductor Optical Amplifier Module; May 99 Alcatel Optronics; 2 pages.

(List continued on next page.)

Primary Examiner—Mark Hellner
(74) Attorney, Agent, or Firm—Fenwick & West LLP

(57) ABSTRACT

An optical amplifier module that is insensitive to polarization comprises a first fiber, a second fiber, a semiconductor optical amplifier (SOA), and a polarization dependent loss (PDL) unit. The first fiber provides for optical input to the SOA. The SOA amplifies the optical signal received and outputs the amplified signal. The output of the SOA is optically coupled to the unit. The PDL unit provides polarization dependent loss and the loss is preferably selected to match the polarization dependent gain of the SOA such that when two are coupled there is no overall polarization dependence. The output of the PDL is optically coupled to the fiber for transmission output. The present invention also comprises a method for manufacturing an optical amplifier module that comprises the steps of: determining the polarization dependent gain of an SOA, determining the polarization dependent loss of a plurality of PDL units, selecting a PDL unit such that the polarization dependent loss when coupled to the SOA is reduced, and packaging the SOA and the PDL unit as an optical amplifier module.

16 Claims, 18 Drawing Sheets

SOA w/Variable PDL

OTHER PUBLICATIONS

Alcatel 1921 SOA 1550 nm WDM Semiconductor Optical Amplifier Module; Jun. 1998 Alcatel Optronics; 2 pages.

High–Gain 1310–nm Reflective Semiconductor Optical Amplifiers With Low–Gain Uncertainty; L.F. Tiemeijer, G.N. van den Hoven, P. J. A. Thijs, T. van Dongen, J. J. M. Binsma, E. J. Jansen and A. J. M. Verboven; IEEE Photonics Technology Letters, vol. 9, No. 1, Jan. 1997; pp. 37–39.

27–dB Gain Unidirectional 1300–nm Polarization–Insensitive Multiple Quantum Well Laser Amplifier Module; L. F. Tiemeijer, P. J. A. Thijs, T. van Dongen, J. J. M. Binsma, E. J. Jansen, and A. J. M. Verboven; IEEE Photonics Technology Letters, vol. 6, No. 12, Dec. 1994; pp. 1430–1432.

Three–Section Semiconductor Optical Amplifier For Monitoring Of Optical Gain; M. A. Newkirk, U. Koren, B. I. Miller, M. D. Chien, M. G. Young, T. L. Koch, G. Raybon, C. A. Burrus, B. Tell, and K. F. Brown–Goebeler; IEEE Photonics Technology Letters, vol. 4, No. 11, Nov. 1992; pp. 1258–1260.

Polarisation Insensitive Semiconductor Optical Amplifier With Integrated Electroabsorption Modulators; U. Koren, B. I. Miller, M. G. Young, M. Chien, G. Raybon, T. Brenner, R. Ben–Michael, K. Dreyer, and R. J. Capik; Electronics Letters, 18th Jan. 1996, vol. 32, No. 2; pp. 11–112.

Polarization Insensitive Semiconductor Laser Amplifiers With Tensile Strained InGaAsP/InGaAsP Multiple Quantum Well Structure; M. Joma, H. Horiksaw, C. Q. Xu, K. Yamada, Y. Katoh, and T. Kamijoh; Semiconductor Technology Laboratory, Oki Electric Industry Co. Ltd., Japan; (received Jul. 14, 1992; accepted for publication Oct. 23, 1992); Appl. Phys. Lett. 62 (2), Jan. 11, 1993; pp. 121–122.

1.55–$\mu$m Polarization–Insensitive Optical Amplifier With Strain–Balanced Superlattice Active Layer; A. Godefroy, A. Le Corre, F. Clerot, S. Salaun, S. Loualiche, J. C. Simon, L. Henry, C. Vaudry, J. C. Keromnes, G. Joulie and P. Lamouler; IEEE Photonics Technology Letters, vol. 7, No. 5, May 1995; pp. 473–475.

Polarization Insensitive 1.55 $\mu$m Optical Amplifier With GaAs Delta–Strained $Ga_{0.47}In_{0.53}As$ Quantum Wells; F. Seiferth, F. G. Johnson, S.A. Merritt, S. Fox, R. D. Whaley, Y. J. Chen, M. Dagenais, and D. R. Stone; IEEE Photonics Technology Letters, vol. 9, No. 10, Oct. 1997; pp. 1340–1342.

A Novel Structure Of Delta–Strained Quantum Well For Polarization Insensitive Semiconductor Devices At 1.55 $\mu$m; M. Hovinen, B. Gopalan, F. G. Johnson[a], and M. Dagenais; Department of Electrical Engineering, University of Maryland, College Park, Maryland; [a]Laboratory For Physical Sciences, University of Maryland, College Park, Maryland; pp. 13–14.

Semiconductor Optical Amplifiers; J–M Verdiell, M. Ziari, and A. Mathur; SDL, San Jose, California; pp. 9–10.

Polarization Insensitive Strained Quantum Well Gain Medium For Lasers And Optical Amplifiers; Atul Mathur and P. Daniel Dapkus; Department of Electrical Engineering—Electrophysics, University of Southern California, Los Angeles, California; received Jul. 17, 1992; accepted for publication Oct. 1, 1992; Appl. Phys. Letter 61 (24), Dec. 14, 1992; pp. 2845–2847.

Polarization Insensitive Multiple Quantum Well Laser Amplifiers For The 1300 NM Window; L. F. Tiemeijer, P. J. A. Thijs, T. van Dongen, R. W. M. Slootweg, J. M. M. van der Heijden, J. J. M. Binsma, and M. P. C. M. Krijn[a] Philips Optoelectronics Centre; received Sep. 8, 1992; accepted for publication Dec. 16, 1992. Appl. Phys. Lett. (8) Feb. 22, 1993; pp. 826–828.

Atmospheric Pressure MOVPE Growth Of High Performance Polarisation Insensitive Strain Compensated MQW InGaAsP/InGaAs Optical Amplifier; A. Ougazzaden, D. Sigogne, A. Mircea, E.V.K. Rao, A. Ramdane and L. Silvestre; Electronics Letters, 20th Jul. 1995; vol. 31, No. 15; pp. 1242–1244.

1.55 $\mu$m Polarisation Insensitive InGaAsP Strained MQW Optical Amplifier Integrated With Short Spot–Size Converters; D. Sigogne, A. Ougazzaden, D. Meichenin, B. Mersali, A. Carenco, J.C. Simon, I. Valiente, C. Vassallo and L. Billes; Electronics Letters 18th Jul. 1996; vol. 32, No. 15; pp. 1403–1405.

Polarization Insensitive Traveling Wave Type Amplifier Using Strained Multiple Quantum Well Structure; Katsuaki Magari, Minoru Okamoto, Hiroshi Yasaka, Kenji Sata, Yoshio Noguchi, and Osamu Mikami; IEEE Photonics Technology Letters, vol. 2, No. 8, Aug. 1990; pp. 556–558.

Polarization Independent Bulk Active Region Semiconductor Optical Amplifiers For 1.3 $\mu$m Wavelengths; Ch. Holtmann, P.–A. Besse, T. Brenner, and H. Melchior; IEEE Photonics Technology Letters, vol. 8, No. 3, Mar. 1996; pp. 343–345.

Polarization–Insensitive Semiconductor Optical Amplifier Array Grown By Selective MOVPE; S. Kitamura, K. Komatsu and M. Kitamura; IEEE Photonics Technology Letters, vol. 6, No. 2, Feb. 1994; pp. 173–175.

Gain Saturation Properties of A Polarization Insensitive Semiconductor Amplifier Implemented With Tensile And Compressive Strain Quantum Wells; Serge Dubovitsky, Atul Mathur, William H. Steier, and P. Daniel Dapkus; IEEE Photonics Technology Letters; vol. 6, No. 2, Feb. 1994; pp. 176–178.

Characterization of Mixed Strain Quantum Well Structures; Kushant Uppal, Dennis Tishinin, and P. D. Dapkus, National Center For Integrated Photonic Technology, Department of Material Science/Electrophysics, University of Southern California, Los Angeles, California; Received Mar. 22, 1996; accepted for publication Sep. 9, 1996; J. Appl. Phys. 81 (1), Jan. 1, 1997; pp. 390–393.

1.3–$\mu$m Polarization Insensitive Amplifiers With Integrated––Mode Transformers; Dennis Tishnin, Kushant Uppal, In Kim, and P. Daniel Dapkus, Fellow, IEEE Photonics Technology Letters, vol. 9, No. 10, Oct. 1997; pp. 1337–1339.

1.55 $\mu$m Polarization–Insensitive High–Gain Tensile–Strained–Barrier MQW Optical Amplifier; Katsuaki Magari, Minoru Okamoto, and Yoshio Noguchi; IEEE Transactions Photonics Technology Letters, vol. 3, No. 11, Nov. 1991; pp. 998–1000.

1.5 $\mu$m Multiquantum–Well Semiconductor Optical Amplifier With Tensile And Compressively Strained Wells For Polarization–Independent Gain; M.A. Newkirk, B.I. Miller, and U. Koren, M.G. Young, M. Chien, R.M. Jopson, and C.A. Burrus; IEEE Photonics Technology Letters, vol. 4, No. 4, Apr. 1993; pp. 406–408.

* cited by examiner

SOA w/ PDL & Tunable Loss

PDL as offset fiber

Method of Manufacture

POLARIZATION INSENSITIVE SEMICONDUCTOR OPTICAL AMPLIFIER

CROSS-REFERENCES TO RELATED APPLICATIONS

This application relates to U.S. patent application Ser. No. 09/273,813, entitled "Tunable-Gain Lasing Semiconductor Optical Amplifier," filed on Mar. 22, 1999, which is incorporated herein by reference, and U.S. patent application Ser. No. 09/09/416,817, entitled "Low-Noise, High-Power Optical Amplifier," filed on Oct. 12, 1999, which is incorporated herein by reference.

BACKGROUND OF THE INVENTION

1. Field of the Invention

The present invention relates to optical communications systems. More particularly, the present invention relates to polarization independent optical amplifiers. Still more particularly, the present invention relates to a method for packaging semiconductor optical amplifiers that eliminates polarization dependence.

2. Description of the Background Art

Optical communications systems are rapidly becoming a widespread and dominant technology in telecommunications and networking. Optical communications systems transmit information optically at very high speeds over fiber optics. The basic components of an optical communications system include: an optical transmitter; fiber optics, and an optical receiver. An optical transmitter incorporates information to be communicated into an optical signal and sends the optical signal. Fiber optics carries the optical signal over a distance. Finally, the optical receiver receives the optical signal and recovers the information therein.

A particular problem in optical communications is attenuation of the optical signal. The attenuation may occur due to transmission of the signal, distribution of the signal, and losses due to insertion of components in the transmission path. Optical amplifiers are used to compensate for signal attenuation. One conventional type of optical amplifier is a Semiconductor Optical Amplifier (SOA). Conventional semiconductor optical amplifiers comprise a semiconductor laser like structure that operates below the lasing threshold. Typically, an electrical current is used to pump the electronic population in the active region of the amplifier. The optical signal is input from fiber optics to the active region of the amplifier, experiences gain due to stimulated emission as it passes through the active region, and is output in amplified form to further fiber optics. Such a conventional SOA is shown in FIG. 1.

Polarization dependence/sensitivity (TE/TM differential gain) is another problem for optical networks. Light can be divided into two polarizations, and in an optical fiber, it varies randomly between these polarizations with time. If a device in an optical communication system has polarization dependent output properties such as polarization dependent gain or loss, then the output signal power can vary with time. This causes problems in the network because it causes signal levels to change with time in an uncontrollable manner, particularly when several of these devices are cascaded in series.

One particular problem with SOAs is that they are inherently polarization sensitive asymmetrical structures. The optical fiber imparts cylindrical coordinates that are perfectly symmetric and does not have significant polarization dependence. However, SOA waveguides generally have a planar geometry such as a rectangular cross-section 0.5 microns by 3 microns, in addition to having actual material gain that can be different for the two polarizations. Thus, it is very difficult to eliminate polarization dependent gain (loss) from SOAs.

There have been attempts in the prior art to reduce and eliminate the polarization dependence of SOAs. In particular, the prior art has attempted to reduce the polarization sensitivity with on-chip techniques that change the structure of the SOA. However, these attempts at an on-chip solution are difficult to manufacture and have had limited success. It is very difficult to correct for polarization dependent gain because of the very precise thickness control and precise strain control required when manufacturing SOAs. For example, SOAs may require that strain be controlled within +/−0.2 percentage to achieve +/−0.5 dB polarization dependence (See, Bart H. Verbeek, Leo H. Spiekmann, Talk CThG3, Conference on Lasers and Electro-optics, San Francisco, Calif., May 7–12, 2000). This corresponds to requiring that material composition be controlled within about 0.1%. The prior art is not able to control the semiconductor processing steps to the extent necessary to produce SOAs having less than 1 dB polarization sensitivity. Furthermore, the SOAs need to be polarization insensitive at all wavelengths and at all operating currents and that adds additional complexity to the design and semiconductor processing. For the present application, polarization insensitive is defined to be having polarization sensitivity of less than 1 dB.

Thus, there is a need for a system and method for manufacturing polarization insensitive SOAs.

SUMMARY OF THE INVENTION

The problems and disadvantages heretofore associated with the prior art are overcome by the present invention. The present invention is an optical amplifier module that is insensitive to polarization. The optical amplifier module of the present invention preferably comprises a first fiber, a second fiber, a semiconductor optical amplifier (SOA), and a polarization dependent loss (PDL) unit. In a preferred embodiment, the first fiber provides for optical input, and is optically coupled to the SOA. The SOA amplifies the optical signal received from the first fiber and outputs the amplified signal. The output of the SOA in turn is optically coupled to the PDL unit. The PDL unit provides polarization dependent loss and the loss is preferably selected to match the polarization dependent gain of the SOA such that when two are coupled there is no polarization dependence. In other words, the loss added by the PDL unit makes the gain from input to the SOA to output by the PDL unit the same for both polarizations. The output of the PDL is optically coupled to the fiber for transmission output. In one exemplary embodiment, the PDL unit is a predetermined length of fiber, at a predetermined rotational position, made from a predetermined material, with a known polarization dependent loss such that the polarization dependent loss in the fiber matches the polarization dependent gain of the SOA.

The present invention also comprises a method for manufacturing an optical amplifier module that is polarization insensitive. The method comprises the steps of: determining the polarization dependent gain of an SOA, determining the polarization dependent loss of a plurality of PDL units, selecting a PDL unit such that the overall polarization dependent loss when coupled to the SOA is reduced, and packaging the SOA and the PDL unit as an optical amplifier module.

BRIEF DESCRIPTION OF THE DRAWINGS

The teachings of the present invention can be readily understood by considering the following detailed description in conjunction with the accompanying drawings. The drawings are not necessarily done to scale.

DETAILED DESCRIPTION OF THE EMBODIMENTS

Figure 1:
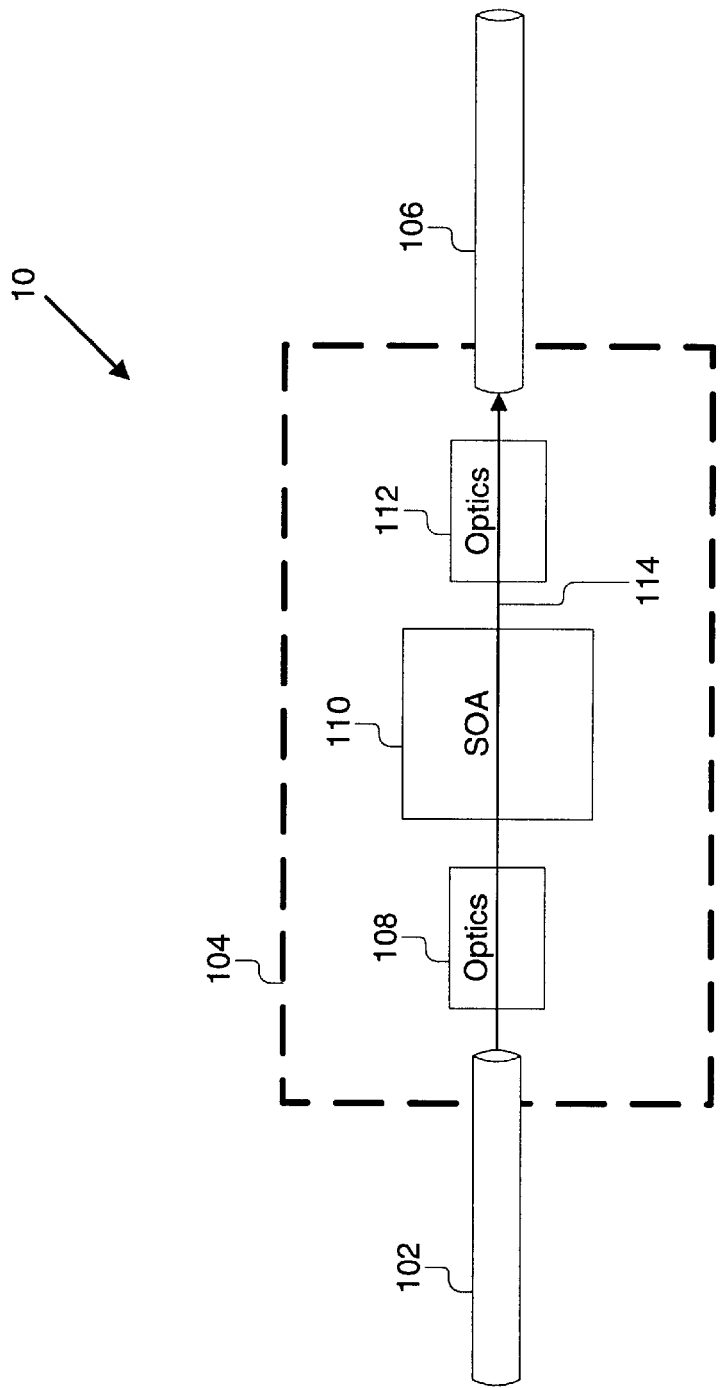
FIG. 1 is a schematic diagram of a conventional semiconductor optical amplifier (SOA) including packaging.

The present invention will now be described with respect to a number of different embodiments. For each embodiment, like reference numerals are used to indicate like parts with the same or similar functionality for ease of understanding and convenience. Furthermore, the present invention is described below in the context of a gain-clamped semiconductor optical amplifier, however, the present invention is applicable to all types of semiconductor optical amplifiers. Nonetheless, the present invention is most advantageous with a gain-clamped semiconductor optical amplifier because the polarization dependent gain in the optical amplifier can be predetermined and is independent of the input optical signal since the gain is clamped.

Standard SOA Module

Referring now to FIG. 1, a block diagram of a conventional semiconductor optical amplifier module 10 is shown. The optical amplifier module 10 includes an input fiber 102, optics 108, 112, a semiconductor optical amplifier (SOA) 110, and an output fiber 106 together in a package 104. The input fiber 102 is optically coupled to the SOA 110 by optics 108 such as a lens. The SOA 110 is a conventional semiconductor optical amplifier chip. The SOA 110 provides in-line amplification and its output is optically coupled by optics 112 such as a lens to the output fiber 106. The light travels along the path generally illustrated by line 114. For example, the optical amplifier module 10 can be a 1901 SOA or a 1921 SOA manufactured and sold by Acatel Telecom of Reston, Va. Such prior art SOA modules have a polarization sensitivity from 1 to 3 dB. Present day SOAs have been able to limit the polarization sensitivity only to 0.5 dB at best.

SOA Module Architectures

Figure 2:
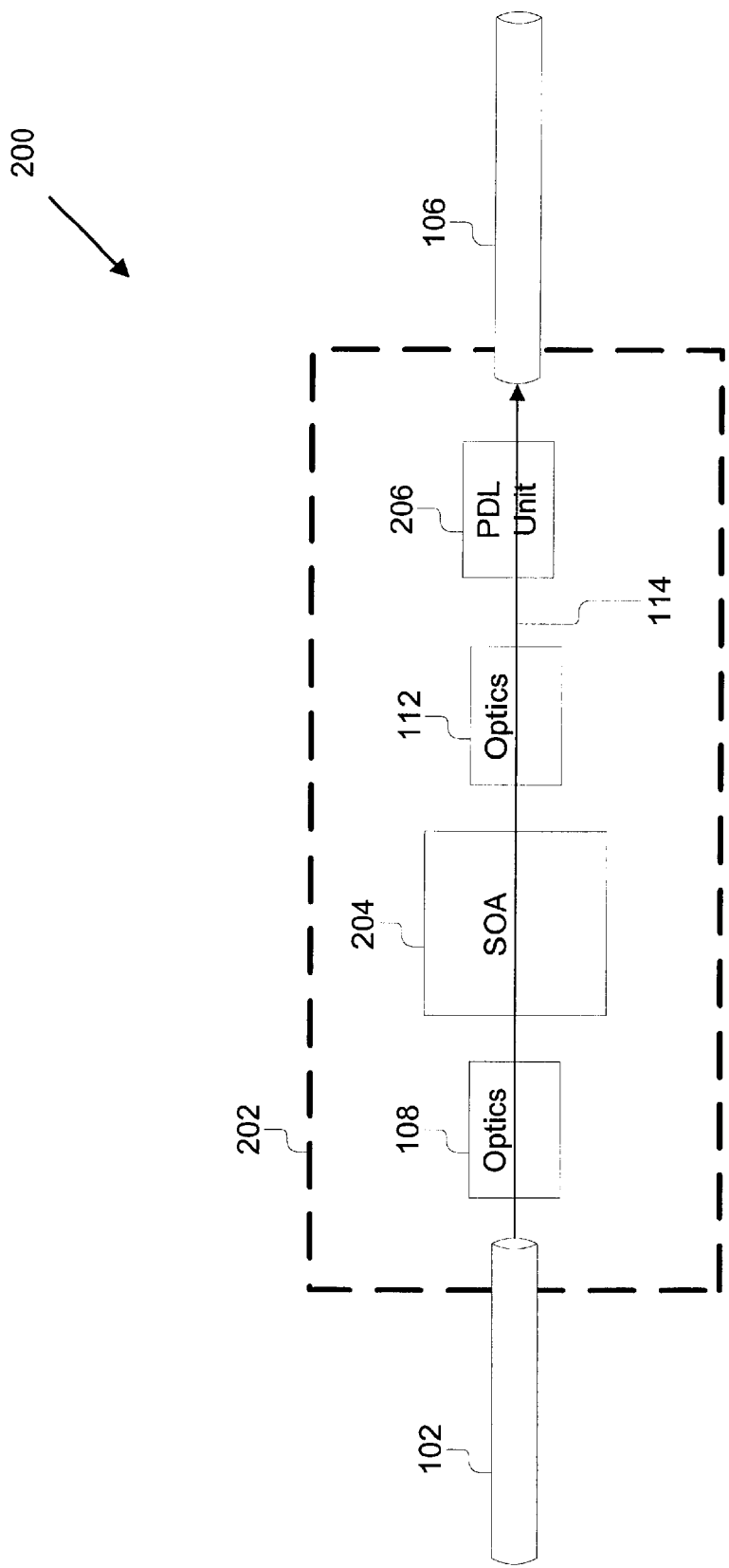
FIG. 2 is a schematic diagram of a first and preferred embodiment of a packaged semiconductor optical amplifier (SOA) having polarization dependent loss constructed in accordance with the present invention.

Referring now to FIG. 2, a block diagram of a semiconductor optical amplifier module 200 constructed according to the present invention is shown. The optical amplifier module 200 preferably includes an input fiber 102, optics 108, 112, a semiconductor optical amplifier (SOA) 204, a polarization dependent loss (PDL) unit 206, and an output fiber 106 together in a package 202. The input fiber 102 and output fiber 106 are of a conventional type and are respectively coupled to receive and transmit optical signals. The optics 108, 112 are also of a conventional type such as lenses. The optics 108 is preferably one or more lenses for focusing the light from the output of the first fiber 102 to the active region of the SOA 204. Those skilled in the art will recognize that a lensed fiber (a fiber with a lens cut into end) may be substituted for the separate optics 108 & fiber 102. The optics 112 is one or more lenses for focusing the light from the SOA 204 to the input of the PDL unit 206 and onto the second fiber 106. Those skilled in the art will recognize that in an alternate embodiment, the PDL unit 206 and the fiber 106 may be the same fiber. In such an embodiment, the polarizing fiber may be part of the "pigtail". The pigtail is the length of fiber coming out of the smaller SOA package that is there for splicing into the fiber-optic system. For example, the present invention might be a 2×1×1 cm metal chip package 202, with ~1 meter fibers coming out each end.

The SOA 204 is optically coupled to the first fiber 102 by the optics 108. The SOA 204 is preferably a semiconductor optical amplifier with low polarization dependent gain that provides in-line amplification. Low polarization dependent gain is defined to be polarization sensitivity of less than 3 dB. In this patent application, SOA 204 refers only to the integrated circuit or chip portion of optical amplifiers. It does not include packaging, optics or other portions of what are defined in the art as SOAs. The SOA 204 also has measurable output characteristics, in particular, the polarization dependent gain in the SOA itself. In an exemplary embodiment, the SOA 204 is a gain clamped SOA such as described in U.S. patent application Ser. No. 09/273,813, entitled "Tunable-Gain Lasing Semiconductor Optical Amplifier," filed on Mar. 22, 1999, which is incorporated herein by reference. In an alternate embodiment, the SOA 204 may be low-noise semiconductor optical amplifier such as described in U.S. patent application Ser. No. 09/09/416, 817, entitled "Low-Noise, High-Power Optical Amplifier," filed on Oct. 12, 1999, which is incorporated herein by reference. Those skilled in the art will recognize that the SOA 204 may also be any one of a conventional type know in the art such as those using a quantum well or double heterostructure active region.

As noted above, the SOA 204 is preferably a gain clamped SOAs. The method of present invention for correcting PDL with a packaging solution is particularly effective with gain-clamped SOAs. The reason is that in a conventional SOA, the TE/TM gain ratio can change as a function of operating current, and it can change as a function of the input signal (due to gain saturation). In the gain-clamped SOAs, the TE/TM gain ratio is fixed for the SOA chip and does not change with operating current or input signal. Thus, the SOA properties are more fixed, and they can be corrected for more effectively with a fixed PDL in the package. Thus, the present invention is particularly advantageous for gain-clamped SOAs, although it will still be beneficial for standard SOAs.

The PDL unit 206 is preferably optically coupled at the output of the SOA 204. The PDL unit 206 is a device that provides polarization dependent loss. Those skilled in the art will recognize that the PDL unit 206, may be instead a polarization dependent gain unit (not shown) where the gain favors the opposite polarization than the polarization dependent gain of the SOA. At a minimum, the polarization output characteristics of the PDL unit 206 are matched to the polarization output characteristics of the SOA 204. In other words, the TE/TM loss values are about the same as the SOA 204. The PDL unit 206 may take a variety of forms so long as the device provides polarization dependent loss that is matched (approximately the same as) to the polarization dependent gain of the SOA 204. Thus, when the SOA 204 and the PDL unit 206 are optically coupled in series, there is improved polarization independence. In the preferred embodiments of the present invention, polarization dependence is reduced to less than 0.5 dB. Various preferred embodiments for the PDL unit 206 will be described in more detail below with reference to FIGS. 6–10. The output of the PDL unit 206 is coupled by the optics 112 to the second fiber 106.

All of the components of the semiconductor optical amplifier module 200 are placed together in a package 202. In other words, the present invention determines the polarization dependent gain of the SOA 204, and then corrects for it with the PDL unit 206 that is in essence a packaging solution to making the semiconductor optical amplifier module 200 polarization insensitive. The package 202 is preferably sized to according to the embodiment. Exemplary embodiments include: a) the ~1×1×2 cm SOA chip package, b) this package+the fiber pigtails, c) the SOA package is in a larger deck-of-cards box with a commercial PDL unit, d) a rack-mounted or stand alone box with power supplies, electronics, the SOA, and a PDL unit within the same larger piece of equipment. Finally, those skilled in the art will recognize that the PDL unit 206 could alternatively be coupled between the optics 108 and the SOA 204. However, because of the noise characteristics of the SOA 204 it is advantageous and preferred for the PDL unit 206 to be positioned after the SOA 204.

While the PDL unit 206 is and will be described below as a unit that introduces polarization dependent loss, those skilled in the art will recognize that the PDL unit 206 could be replaced by a polarization dependent gain (PDG) unit to accomplish the same result of the present invention namely polarization insensitivity. More particularly, such a PDG unit is preferably a gain-clamped SOA. Thus, one exemplary embodiment for a polarization insensitive module include a pair of gain-clamped SOA coupled back to back with a quarter wave plate between them to rotate the polarization so TE in the first SOA becomes TM in the second and vice versa. It should be understood that such a PDG unit is within the spirit and scope of the present invention.

Figure 3:
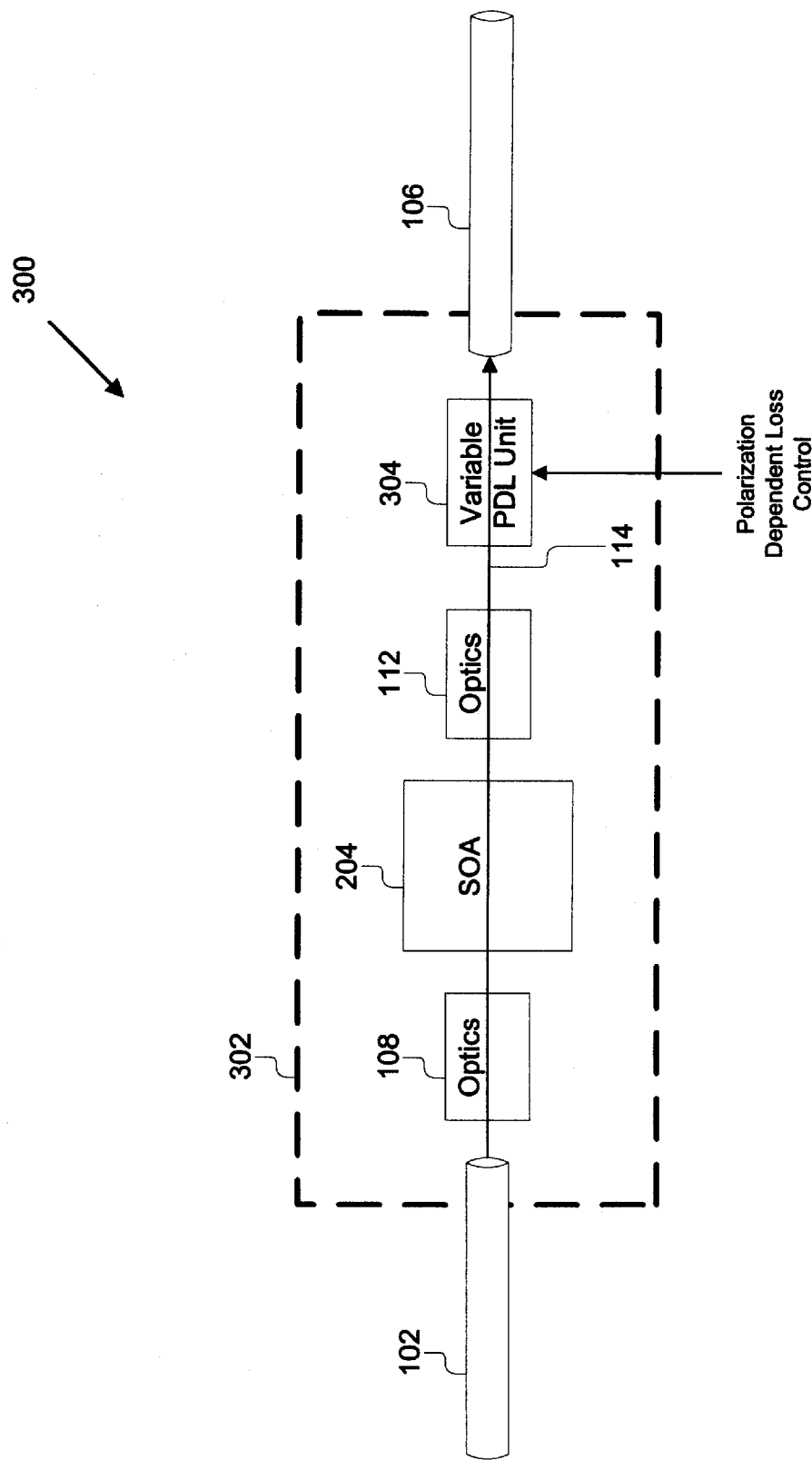
FIG. 3 is a schematic diagram of a preferred embodiment of a packaged semiconductor optical amplifier (SOA) having variable polarization dependent loss in accordance with the present invention.

Referring now to FIG. 3, a block diagram of a preferred embodiment of a SOA module 300 having variable polarization dependent loss in accordance with the present invention is shown. The SOA module 300 is similar to the embodiment described above with reference to FIG. 2 and comprises the input fiber 102, optics 108, 112, the SOA 204, a variable polarization dependent loss (PDL) unit 304, and the output fiber 106 together in a package 302. The input fiber 102, optics 108, 112, SOA 204, and output fiber 106 are the same as described above so that description will not be repeated here. This SOA module 300 provides the further advantage of enabling adjustment to the amount of polarization dependent loss. This functionality is provided by the variable PDL unit 304 that takes the place of the PDL unit 206. The variable PDL unit 304 is similar to the PDL unit 206 in functionality but also has an input for varying the amount of polarization dependent loss provided by the variable PDL unit 304. This enables fine tuning and adjustment so that the polarization dependent loss can be minimized. The variable PDL unit 304 is optically coupled between the optics 112 and the fiber 106. The variable PDL unit 304 also has an input for providing adjustment of the polarization dependent loss. The variable PDL unit 304 could alternatively be a variable polarization loss source that is either mechanically adjusted to change polarization or electronically adjusted to change polarization loss such as provided by Taliescent of Tucson, Ariz.

Figure 4:
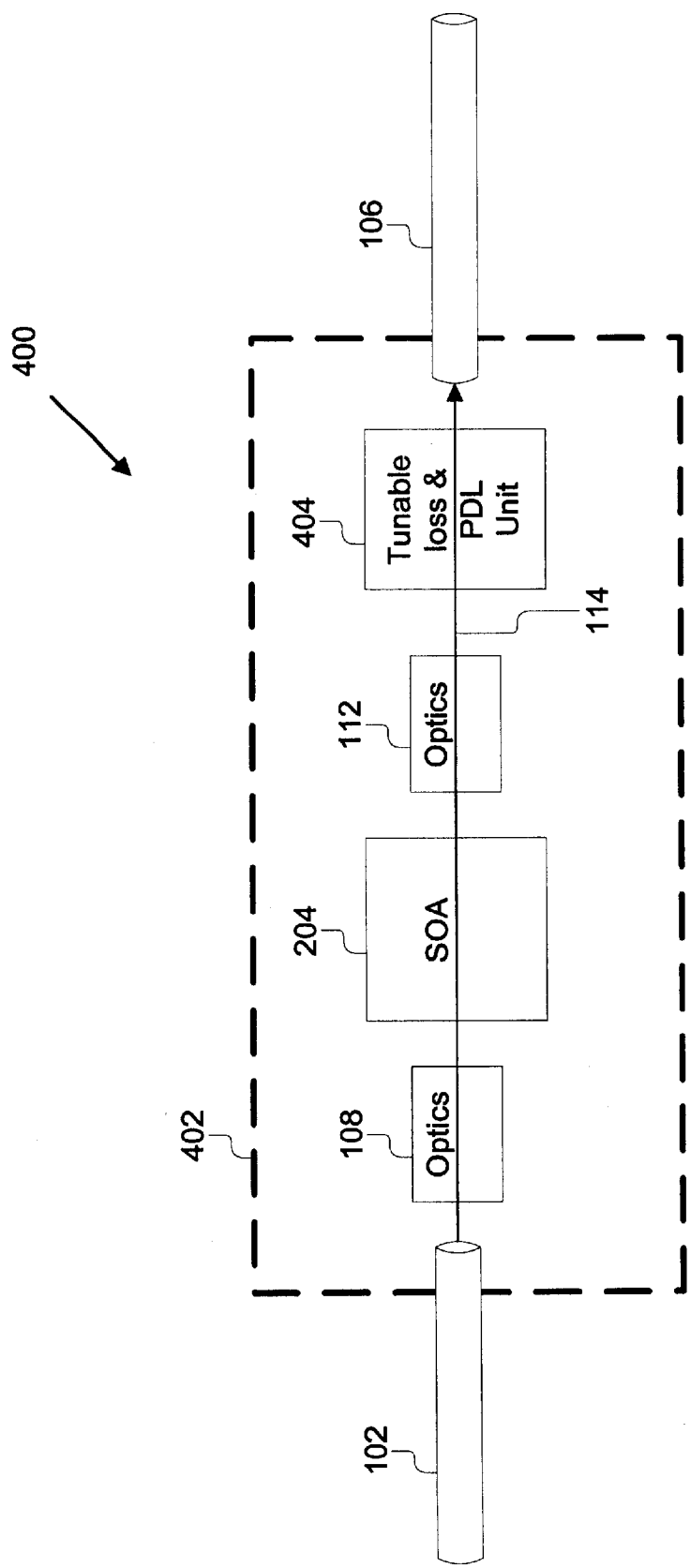
FIG. 4 is a schematic diagram of a preferred embodiment of a packaged semiconductor optical amplifier (SOA) having polarization dependent loss and tunable loss in accordance with the present invention.
Figure 12:
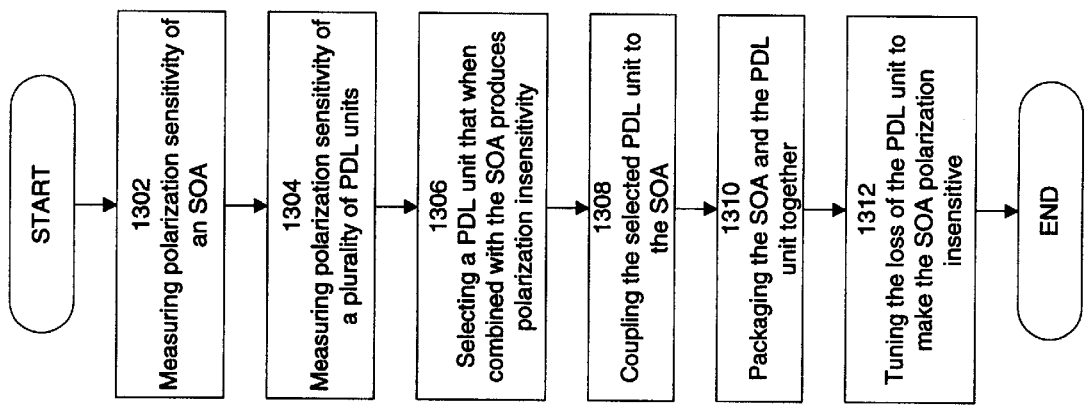
FIG. 12 is a flowchart of a preferred method for manufacturing a polarization insensitive semiconductor optical amplifier.

Referring now to FIG. 4, a block diagram of a preferred embodiment of a SOA module 400 having polarization dependent loss and tunable polarization independent loss in accordance with the present invention is shown. The SOA module 400 is similar to the embodiment described above with reference to FIG. 2 and comprises the input fiber 102, optics 108, 112, the SOA 204, a tunable polarization independent loss and polarization dependent loss (PDL) unit 404, and the output fiber 106 together in a package 42. Again, the input fiber 102, optics 108, 112, SOA 204, and output fiber 106 are the same as described above so that description will not be repeated here. This SOA module 400 provides the further advantage of enabling adjustment to the amount of loss generally in addition to polarization dependent loss. This is of particular importance when the SOA 204 is a gain clamped SOA. Gain clamping fixes most of the problems with SOAs, but it does remove the ability to tune the gain by adjusting the operating current, thus, in a gain clamped SOA the ability to tune back into the device is especially important. In this case, the tunable loss and PDL unit 404 provides dual functionality of making the SOA module 402 polarization insensitive and allowing tuning of the overall gain of the amplifier. A particular embodiment of the tunable loss and PDL unit 404 is shown in FIG. 12 and will be discussed in more detail below.

Figure 5:
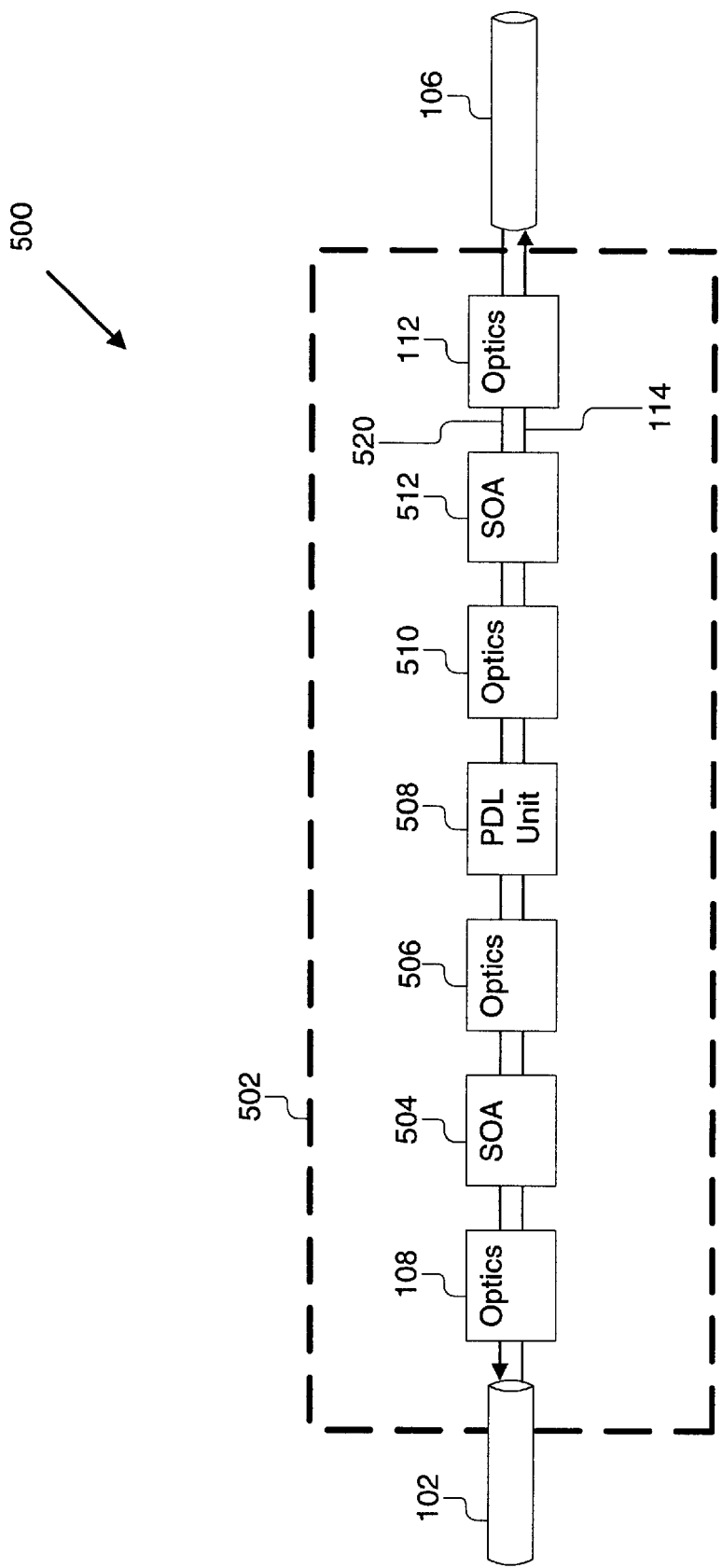
FIG. 5 is a schematic diagram of a second and alternate embodiment of a packaged semiconductor optical amplifier (SOA) having polarization dependent loss between two SOAs in accordance with the present invention.

Referring now to FIG. 5, yet another architecture for an SOA module 500 in accordance with the present invention is shown. The SOA module 500 provides for an SOA that is bi-directional (i.e., light can be sent in both directions through the SOA module 500) and that is polarization insensitive in both directions. The SOA module 500 preferably comprises a first fiber 102, a second fiber 106, optics 108, 112, 506, 510, a first SOA 504, a second SOA 512, a PDL unit 508 together in a package 502. Again, the first fiber 102, optics 108, 112, and output fiber 106 are the same as described above so that description will not be repeated here. The additional optics 506 and 510 are of a conventional type for sending and receiving light to and from the PDL unit 508. The first fiber 102 optically couples to the first SOA 504 with the optics 108. The first SOA 504 is also coupled to the PDL 508 by the optics 506. The PDL 508 is also coupled to the second SOA 512 by optics 510. The optics 112 couples the second SOA 512 to the second fiber 106. As noted above, this architecture is bi-directional in that the light can travel along a path generally shown by line 114 from left to right through the SOA module 500. The signal may also and simultaneously travel along a path generally shown by line 520 from right to left through the SOA module 500. The PDL unit 508 positioned between the two SOAs 504, 512 advantageously minimizes the noise properties and provides polarization independence in both directions.

Polarization Dependent Loss Units

A. Fixed Polarization Dependent Loss Units

Figure 6A:
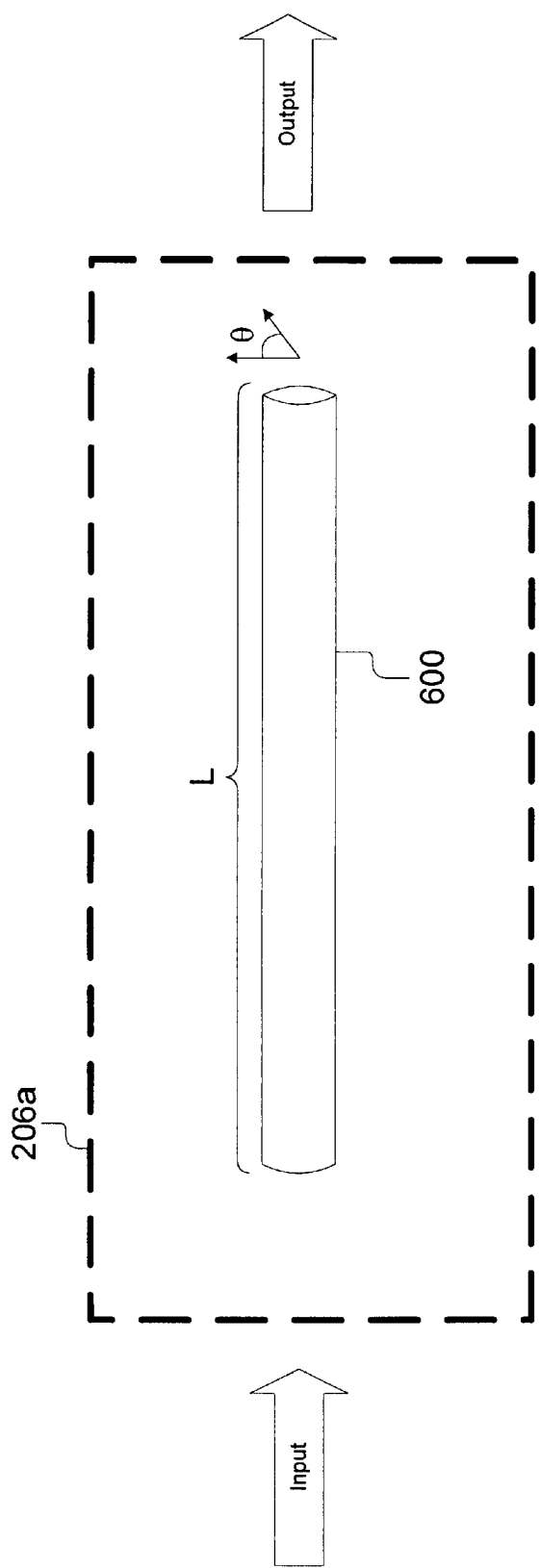
FIG. 6A is a block diagram of a first and preferred embodiment for a polarization dependent loss unit as a polarizing fiber.

Referring now to FIG. 6A, a first and preferred embodiment for the PDL unit 206a is shown. The PDL unit 206a provides polarization dependent loss that matches the polarization dependent gain in the SOA 204. This loss can be created by any device or structure that is able to produce the matching polarization dependent loss. In the simplest embodiment, the PDL unit 206a is selected as a polarizing fiber 600. For example, the polarizing fiber may be a predetermined length and spooled on a 3-inch diameter spool. The length of the fiber is based on the loss characteristics that may be 13 dB per meter for particular fibers. The polarization dependent loss of the fiber 600 is selected by varying the material and structure for the fiber 600, the length of the fiber 600 and the rotational angle of the fiber relative the SOA 204. In accordance with the present invention, the polarization dependent gain of the SOA 204 is first measured and determined. Then, a polarizing fiber 600 is selected such that the polarization dependent gain of the SOA 204 is matched by the polarization dependent loss of the fiber 600. This can be done by varying or adjusting one more of the above parameters for polarizing fiber.

Figure 6B:
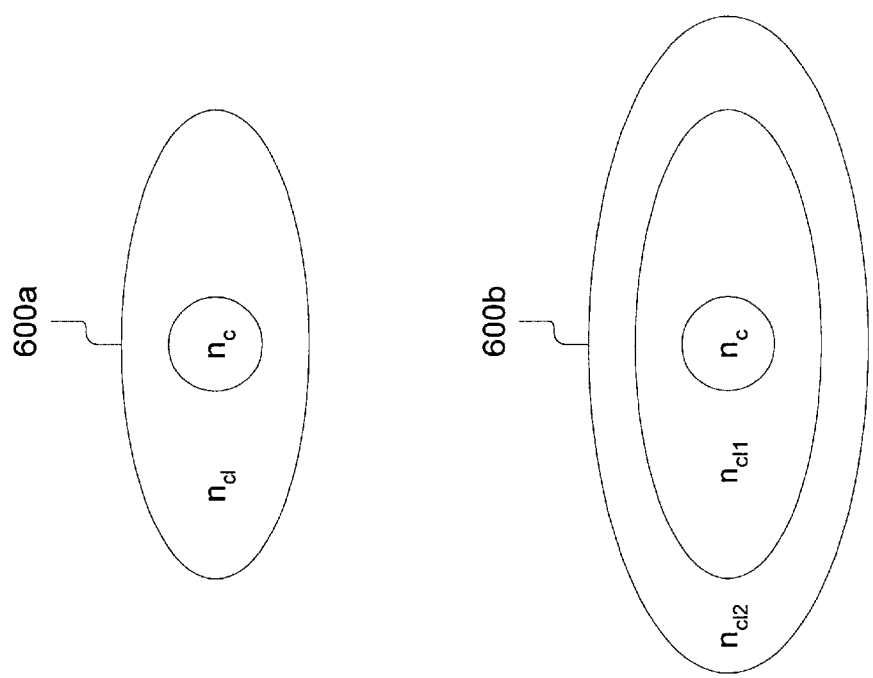
FIG. 6B is an end view of two structures for the polarizing fiber of the present invention.

As shown in FIG. 6B, the fiber 600a is preferably an anisotropic, polarizing fiber having a circular core placed in a highly elliptical inner cladding. Such a fiber and its characteristics are further described in "Simplified Analysis of a Polarizing Optical Fiber," by Dietrich Marcuse, IEEE Journal of Quantum Electronics, March 1990, pp. 550–557. In particular, the fiber 600 has very high loss for light polarized along one axis, and low loss for the other. An alternate embodiment for the fiber 600b is also shown in FIG. 6B. The fiber 600b illustrates the use of a multi-wavelength polarizing or cutoff fiber in situations where the polarizing fiber has significant wavelength dependence. Yet another embodiment for the fiber could include three or more cladding regions instead of one or two. For example, the optical fiber preferably has a germanium doped silica core and a silica cladding.

Figure 6C:
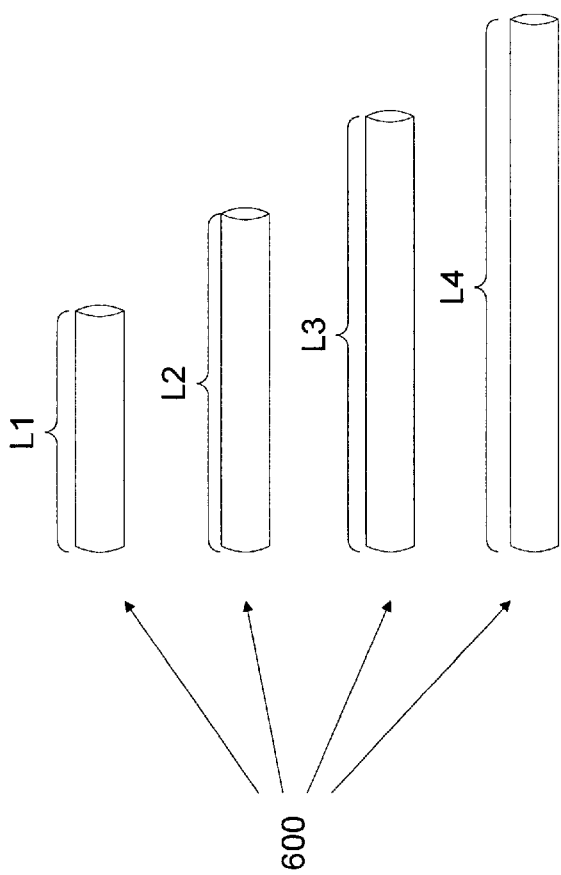
FIG. 6C are side views illustrating various lengths for the polarizing fiber of the present invention.
Figure 6D:
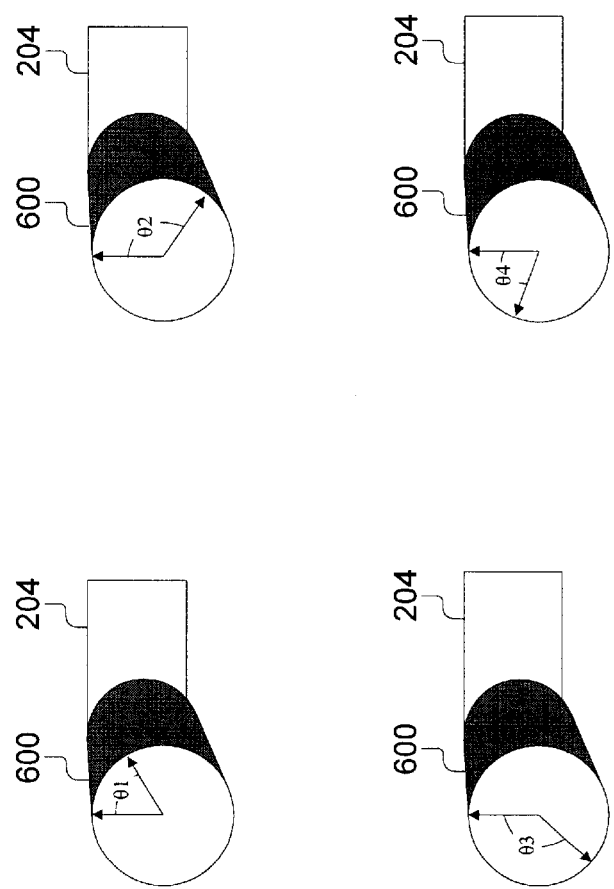
FIG. 6D is a perspective block diagram illustrating the orientation of the PDL unit relative to the SOA to vary the amount of polarization dependent loss.

As shown in FIG. 6C, once the material and structure for the fiber 600 has been selected, the length of the fiber 600 is chosen. As illustrated, the fiber 600 may be selected from a plurality of lengths L1, L2, L3, L4 of the same fiber or cut to a specific length, L. In the preferred embodiment, the polarization dependent gain of the SOA 204 is measured, and the appropriate length, L, of polarizing fiber 600 to achieve the same amount of polarization dependent loss is determined and cut. For example, if the SOA 204 has one dB polarization dependence, the length of the fiber 600 is selected or cut that provides one dB difference in loss between the TE & TM. Finally, the fiber is positioned on the output of the SOA 204. The rotational angel, θ, of the fiber 600 is adjusted until the overall polarization dependent loss is zero or minimized. As shown in FIG. 6D, the fiber 600 may have any rotational angle, θ, with respect to the SOA 204, even though only four are shown in FIG. 6D. For example, the polarizing fiber 600 could be rotated while its output is coupled to a power meter that measures TE/TM input, and polarizing fiber 600 would be mounted in position at the angle that minimizes the overall polarization dependent loss.

Figure 7:
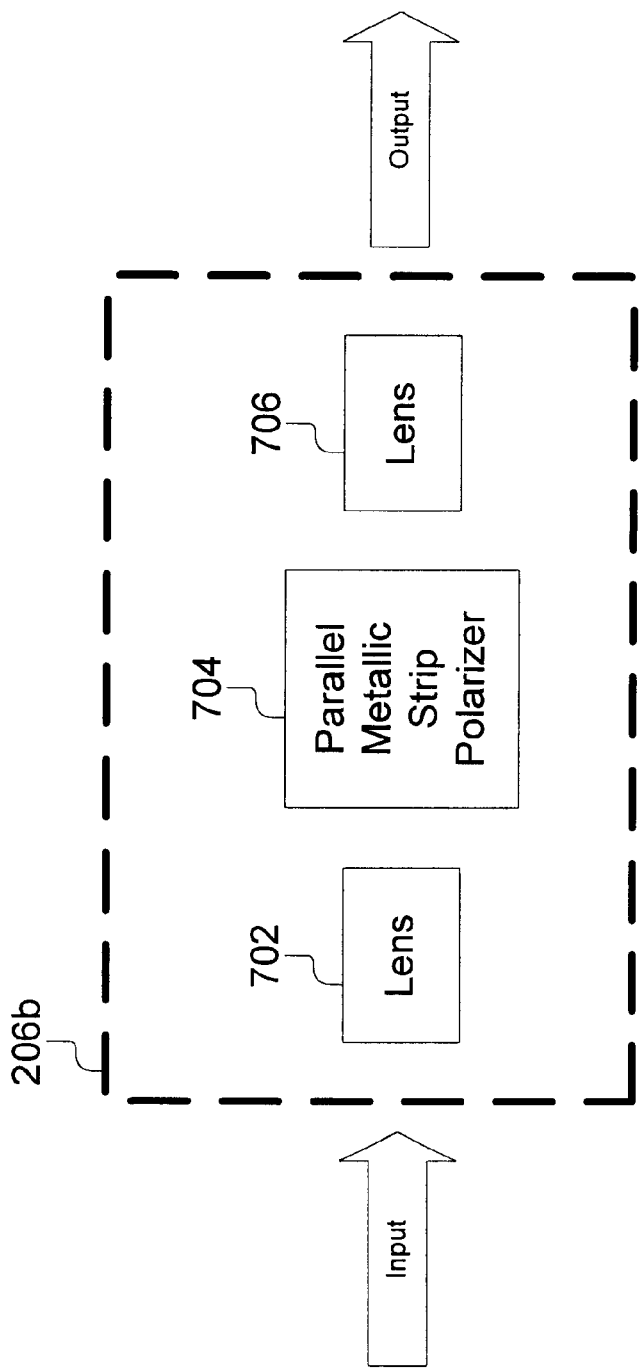
FIG. 7 is a block diagram of a second embodiment for a polarization dependent loss unit.

Referring now to FIG. 7, a second embodiment for the PDL unit 206b is shown. The PDL unit 206b provides polarization dependent loss using a polarizer 704. The PDL unit 206b preferably comprises a first lens 702, a polarizer 704 and a second lens 706. The first and second lenses 702, 706 are provided to optically couple the polarizer 704 with the SOA 204 and the fiber 106, respectively. Those skilled in the art will recognize that the second lens may be eliminated because it is redundant with the optics 112. The polarizer 704 is preferably a parallel-metallic-strip polarizer. Such polarizers are generally described in p. 14–24 of the Melles Griot catalogue titled "Optics Guide 5", copyright 1990. Such parallel-metallic-strip polarizers are formed using thin film technology. In contrast to the prior art, however, the polarizer 704 used in the present invention is modified to provide only a minimal or needed amount of rejection. This can be accomplished by increasing the distance, d, between metallic strips, or by shortening the length, $l_m$, of the metallic strips and introducing gaps of length, $l_g$. For example, a single strip on a prior art polarizer may be divided into several shorter segments with gaps in between them. By systematically varying d or $l_m/l_g$ across, for example, a ~1 cm long sliding polarizing filter, or around a rotating polarizing wheel, the amount of PDL can be varied by illuminating different sections of the filter. Once the polarization dependent gain of the SOA 204 is determined, the first lens 702 is used to localize the beam and illuminate a section of the polarizer 704. Adjusting the angle of the filter to select TE or TM loss, and adjusting the area or section illuminated by the beam to select the magnitude of the loss, compensates for the polarization dependent gain of the SOA 204. The polarization dependent loss can be measured real-time and while the section that is being illuminated is adjusted so that zero polarization dependent loss is achieved.

Figures 8A, 8B:
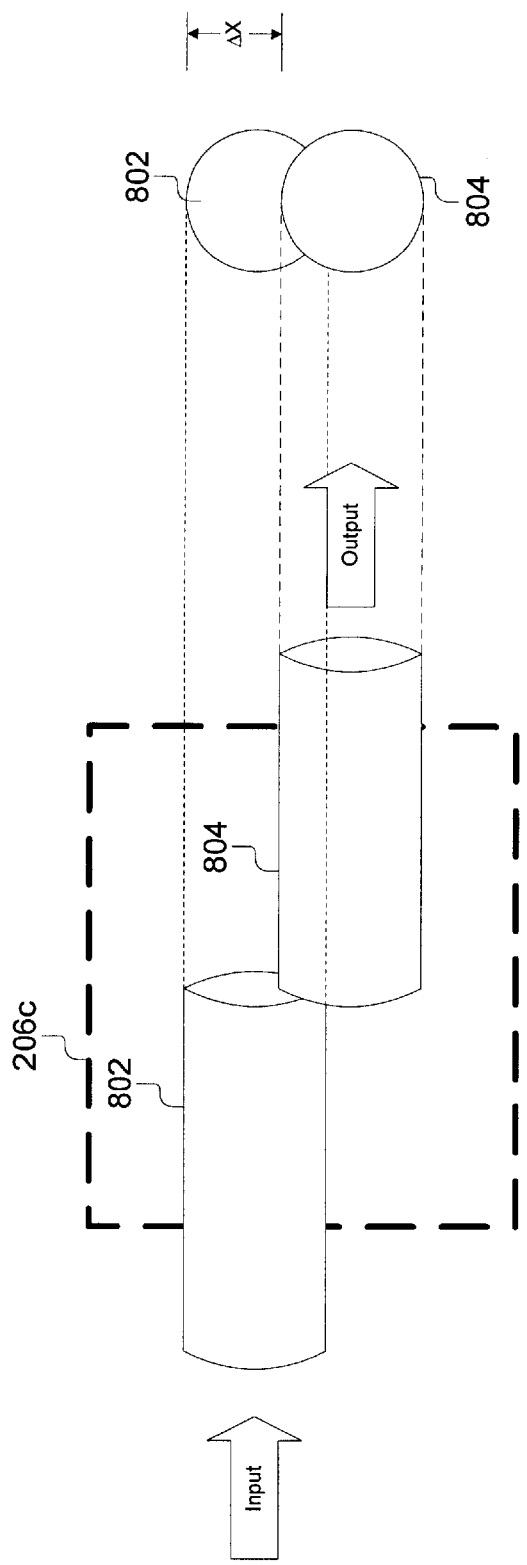
FIGS. 8A and 8B is a block diagram of a third embodiment for a polarization dependent loss unit.

FIGS. 8A and 8B show a block diagram of a third embodiment for a PDL unit 206c. The third embodiment of the PDL unit 206c preferably comprises a first fiber 802 and a second fiber 804. The first and second fibers 802, 804 are preferably butt coupled and offset by a predetermined amount, Δx. By creating a shift of Δx between the two butt-coupled fibers 802, 804, an asymmetry can be introduced thereby providing the different polarizations with different boundary conditions, and thus polarization dependent loss. By adjusting the relative positions of the longitudinal axes of the fibers by adjusting the value of Δx, the polarization dependent loss can be adjusted to match the polarization dependent gain of the SOA 204. Those skilled in the art will recognize that in the preferred embodiment, the fibers are angle-cut so they do not create back reflection. In this embodiment, the longitudinal axes of the fibers 802, 804 are parallel. One skilled in the art will recognize an asymmetry could also be introduced if the fibers 802, 804 were butt coupled by the longitudinal axes of the fibers 802, 804 were positioned with an angle between them. By adjusting the angle, polarization dependent loss could also be introduced and adjusted to match the polarization dependent gain of the SOA 204.

Figure 9:
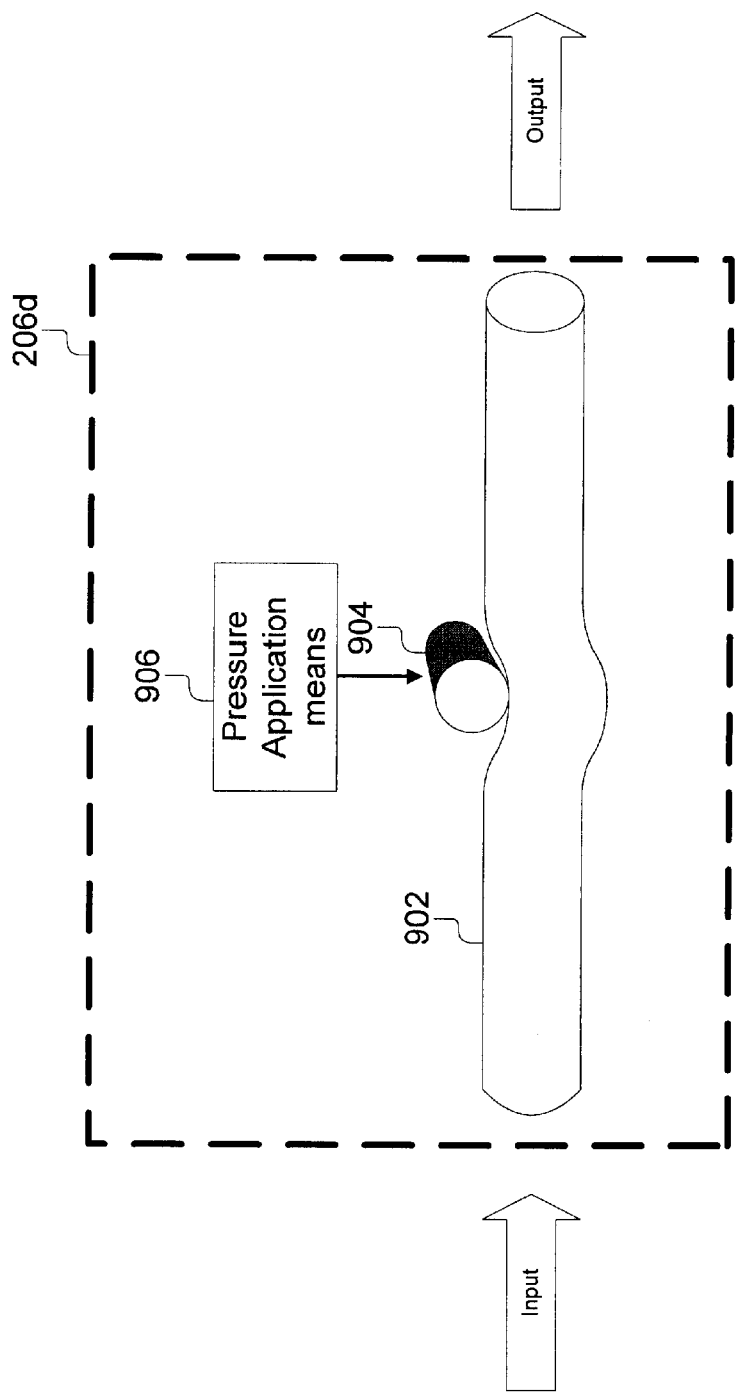
FIG. 9 is a block diagram of a fourth embodiment for a polarization dependent loss unit.

Referring now to FIG. 9, a block diagram of a fourth embodiment for a polarization dependent loss unit 206d is shown. The fourth embodiment for the PDL unit 206d preferably comprises a fiber 902, a rod 904 and a means for applying pressure 906. Like the modification to the third embodiment for a PDL unit 206c just described, this embodiment 206d introduces an asymmetry into the fiber 902 using the rod 904 and the pressure application means 906. Depending on the amount of force applied by the pressure application means 906 to the rod 904, and in turn, the fiber 902; the fiber 902 is bent and asymmetries are introduced. By adjusting the degree to which the fiber 902 is bent by the rod 904, the polarization dependent loss is introduced and adjusted to match the polarization dependent gain of the SOA 204. In the preferred embodiment, the pressure application means 906 is a screw and housing that force the rod 904 downward.

Figure 10A:
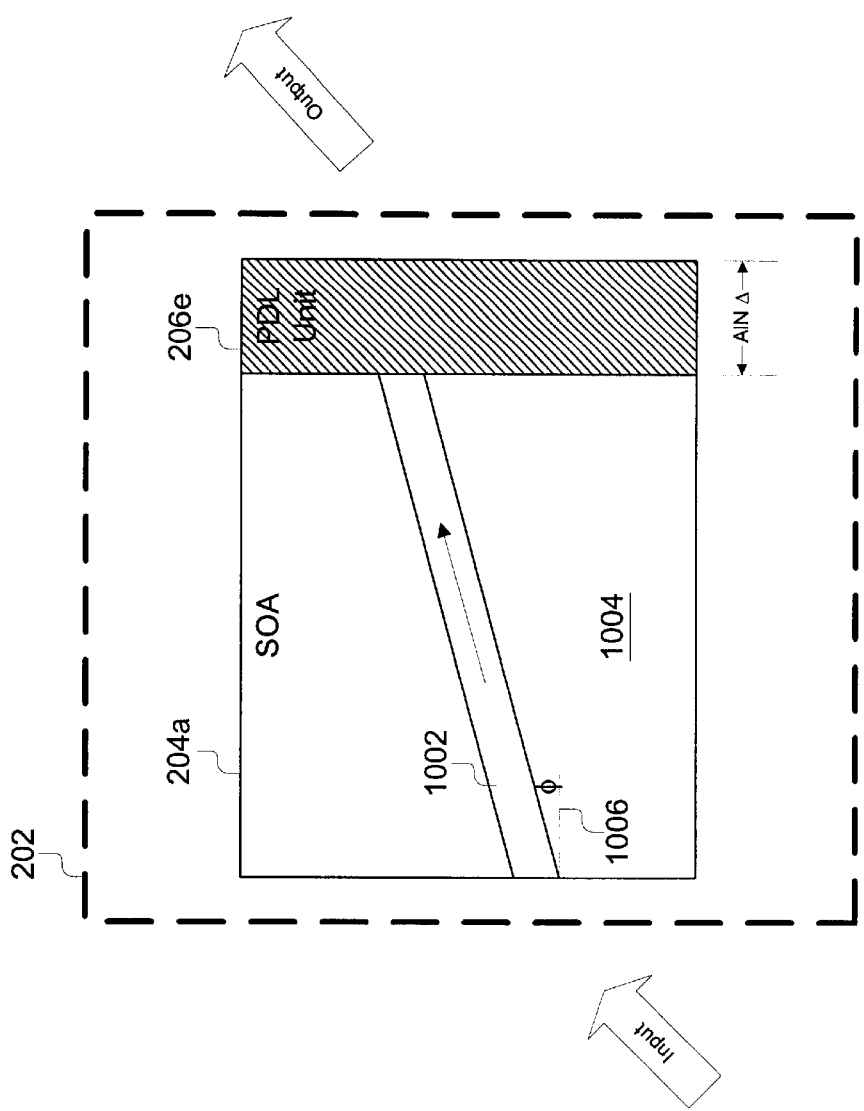
FIG. 10A is a block diagram of a fifth embodiment for a polarization dependent loss unit attached to a preferred embodiment for the SOA.
Figure 10B:
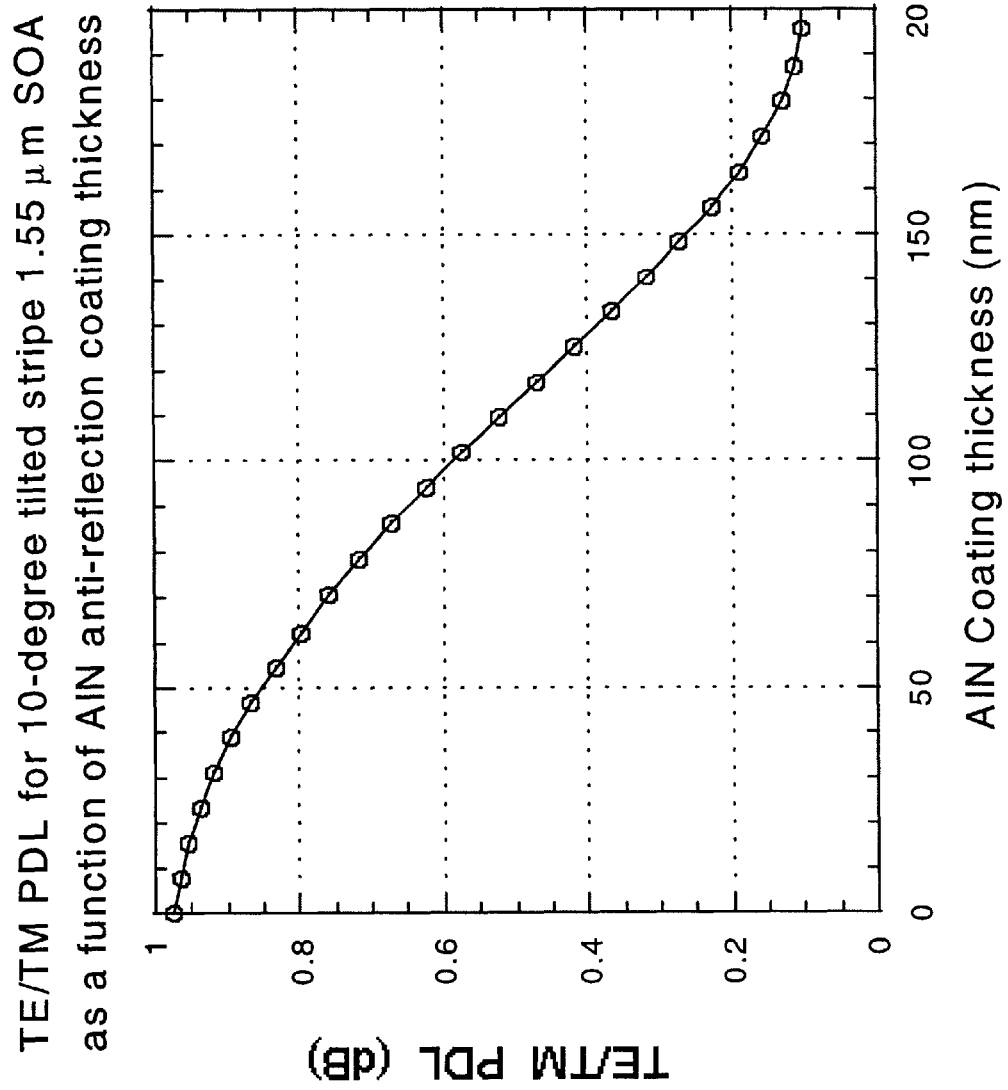
FIG. 10B is a graph illustrating the polarization dependent loss characteristics as a function of the thickness of the thin film that forms the fifth embodiment of the polarization dependent loss unit.

FIG. 10A is a block diagram of a fifth embodiment for a polarization dependent loss unit 206e attached to a preferred embodiment for the SOA 204a. In this embodiment, the PDL unit 206e takes the form of a coating added to the SOA chip 204a. A preferred embodiment of the SOA chip 204a is shown in FIG. 10A. The SOA chip 204a preferably has a "tilted stripe" 1002. The SOA stripe 1002 is preferably tilted on the wafer 1004 by 7 to 12 degrees, $\phi$, from the cleave planes 1006 in order to prevent lasing. As the TE and TM signals leave the SOA chip 204a on the output end, some of the light reflects from the semiconductor/air interface, and is lost. This loss is polarization dependent. Thus, depending on the coating 206e applied to the output end of the SOA chip 204a, the polarization dependence can be adjusted. The PDL unit 206e is preferably a coating of Aluminum-Nitride film, but could be any film used for anti-reflection coating the facets, including multiple-layer films utilizing two or more materials. By varying the thickness, AlN$\Delta$, the ratio of the TM/TE loss is varied. Referring to FIG. 10B, a graph of the correlation between TM/TE loss and Aluminum-Nitride film thickness, AlN$\Delta$, is shown. In particular, FIG. 10B shows the variation in overall TM/TE gain for the SOA as a function of thickness of the AlN film. With this preferred embodiment, the wafer or SOA 204a would first be processed, that has for example a 10-degree tilted stripe and 0.8 dB greater TE gain, and then, in the last step of processing the wafer, a 60 nm thick AlN film would be deposited on the output facet to create a 0.8 dB greater loss for the TE polarization (see FIG. 10B), to make the polarization dependent loss zero. Those skilled in the art will recognize that the input facet could be similarly treated, however, as before, putting loss there adversely affects the noise properties.

Figure 10C:
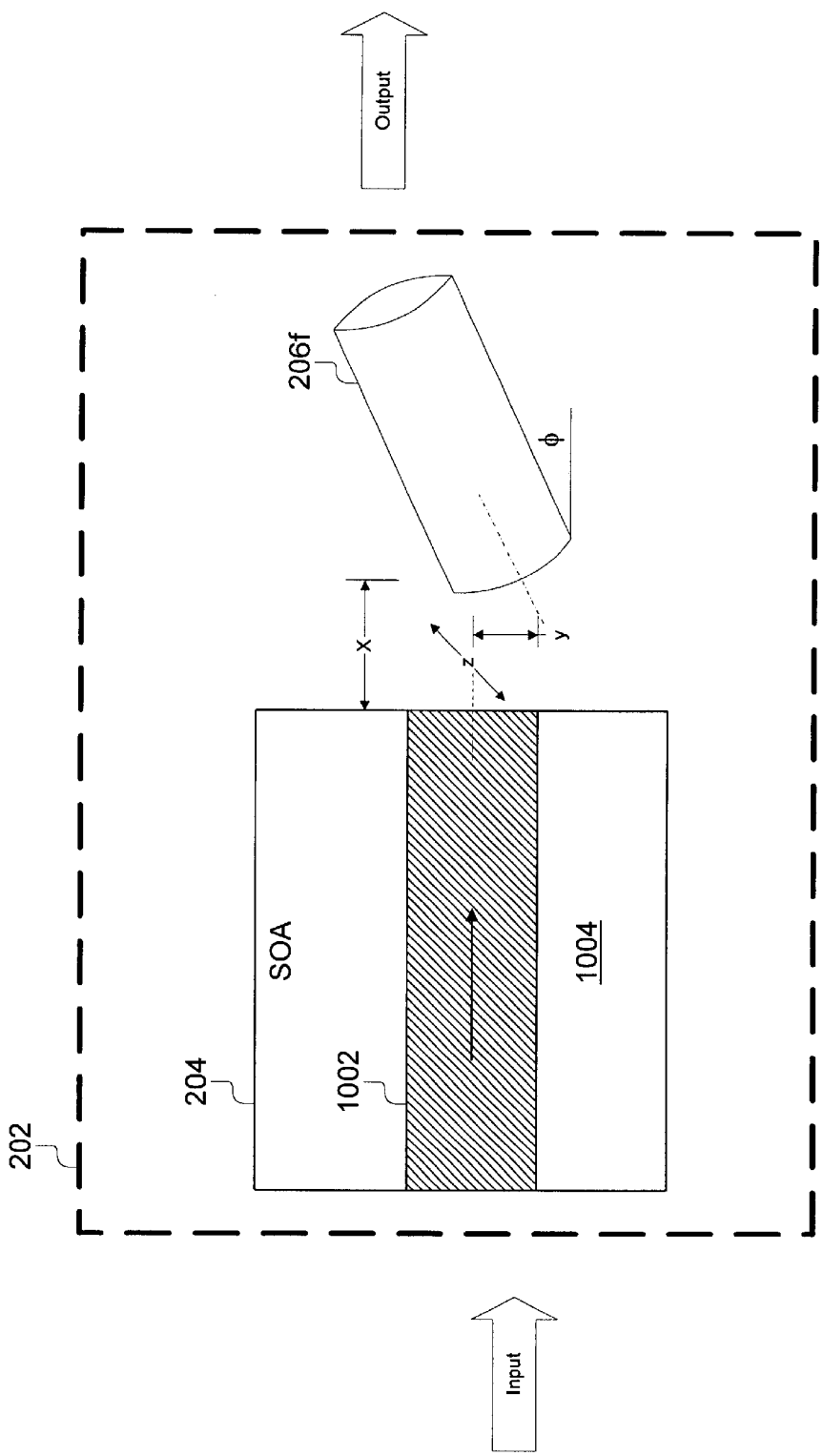
FIG. 10C is a block diagram of a sixth and final embodiment for a polarization dependent loss unit coupled to the SOA.

Referring now to FIG. 10C, a final embodiment for the PDL unit 206f is shown. As noted above, the polarization dependent loss provided by the fiber 206f can be adjusted based on the asymmetries introduced by the orientation of the fiber 206f relative to the SOA 204. The far-field pattern (spreading angle of the light as it leaves the SOA and heads toward the fiber 206f) of the SOA 204 is dependent on polarization type (it is typically different for TE and TM polarizations). Thus, by adjusting x, y, z, or angle of the fiber 206f relative to the SOA 204, the asymmetry of the spreading angles between the TE and TM modes can be used to adjust the relative polarization dependent TE/TM coupling loss so that it matches the SOA 204. Therefore, as has been noted above for particular cases in FIGS. 6D, 8A and 9 above, adjusting x, y, z, or angle of the fiber 206f can be used in accordance with the present invention to match the polarization dependent gain off the SOA 204. Further additional embodiments that provide adjustment of the polarization dependent loss include other structural adjustment to the fiber 206f such as using a lensed fiber (fiber with a lens ground, melted, or etched into the tip of it). These lensed fibers can be made asymmetric with two different radii of curvature in x and y. Having fibers of different curvature, or rotating this type of fiber, also adds variable polarization dependent loss.

B. Variable Polarization Dependent Loss Unit

Those skilled in the art will recognized that while the above preferred embodiment of the present invention has been described as polarization dependent loss having a fixed or predetermined polarization dependent loss, the present invention may employ a variable dependent loss unit 304 in place of the fixed polarization dependent loss unit 206 as illustrated in FIG. 3 described above. For example, for such embodiments, the polarization dependent loss unit 206d described above with reference to FIG. 9 can be variable in the amount to which the fiber 902 is bent by the rod 904. Therefore, the amount of polarization independent loss introduced by the polarization dependent loss unit 206d is variable. Similarly, as note above with reference to FIG. 7, the polarization dependent loss unit 704 described above can be made to be variable depending on the section of the parallel-metallic-strip polarizer 704 that is illuminated. Thus, the present invention includes the use of both fixed polarization dependent loss units and variable polarization dependent loss units.

C. Polarization Dependent Loss Unit with Tunable Loss

Figure 11:
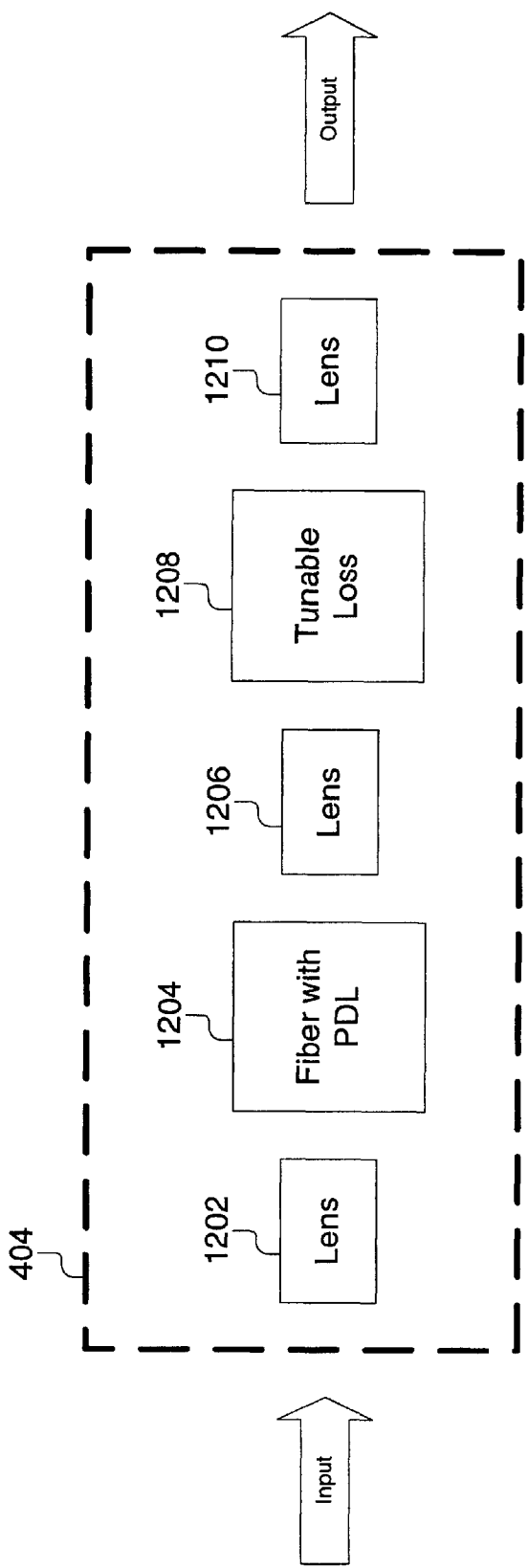
FIG. 11 is a block diagram of a preferred embodiment for a polarization dependent loss unit also having tunable loss.

FIG. 11 is a block diagram of a preferred embodiment for a polarization dependent loss unit also having tunable loss. The tunable loss and PDL unit 404 preferably comprises a first lens 1202, a fiber with polarization dependent loss 1204, a second lens 1206, and a tunable loss element 1208 and a third lens 1210. The first, second and third lenses 1202, 1206, 1210 are of a conventional type and are designed to optically couple the fiber 1204 and the tunable loss element 1208. The fiber 1204 can take any one of the embodiments described above, and could be designed into a second structure used for the tunable loss element 1208. FIG. 11 illustrates that the polarization dependent loss can be combined with a tunable loss. Since it is difficult, for example, to design tunable gain gain-clamped SOA, a tunable loss element could be done off-chip and combined with a fixed gain amplifier (on chip) to provide an overall structure that has tunable gain. The tunable loss element 1208 reduces the strength of the optical signal by a tunable amount and so generates a tunable amplified output. The tunable loss element 1208 may comprise various types of loss elements. The tunable loss element 1208 may comprise, for example, a liquid crystal element whose transmissivity is adjusted by varying the voltage across the liquid crystal. As another example, the tunable loss element 1208 may comprise an element that uses the positioning of a razor edge within the element to adjust the loss induced by the element. In yet another example, the tunable loss element 1208 may comprise an optical attenuator that uses a coupling loss between two fibers to adjust attenuation. As a final example, the tunable loss element 1208 may use graded index (GRIN) lenses to expand the entering optical signal, refocus the exiting optical signal, and place a tunable filter in the expanded beam within the tunable loss element 1208. Those skilled in the art will understand that these various embodiments of the filter elements (LCD, razor edge, and tunable coupling loss) are preferably implemented the same as the tunable filter final example by placing the element between GRIN lenses that expand and refocus the beam.

Manufacture Method

FIG. 12 is a flowchart of a preferred method for manufacturing a polarization insensitive semiconductor optical amplifier. The process for manufacturing and packaging an SOA module that is polarization insensitive has been described in part above for certain portions of the process. Thus, only the general method will be described here. The method begins by measuring 1302 the polarization sensitivity of the SOA 204. This is a manual process in which test equipment is used to determine the polarization dependent gain of the SOA 204. Then a similar process is used to measure 1304 the polarization dependent loss of the PDL unit 206. Next, the method selects 1306 a PDL unit 206 that when optically coupled to the SOA 204 provides the greatest polarization insensitivity. The selected PDL unit 206 is then coupled 1308 to the SOA 204 in the desired position. Next, the SOA 204 and the PDL unit 206 are packaged 1310 together. Finally, in an alternate embodiment that provides a variable PDL unit 304, the PDL unit is fine tuned 1312 to provide further refinement of the insensitivity of the SOA 204.

As an example for the case where the PDL unit 206 is a fiber, the method would produce an SOA 204, solder down the SOA 204, and turn on the SOA 204 so that it is emitting light. The fiber is then aligned while the optical power from the fiber is being measured with a detector. A feedback loop is used to identify the optimal fiber position and then the fiber is laser welded down in the position that provides the optimal polarization insensitivity. It should be noted that the present invention is distinguishable from the prior art because the measuring step is performed to measure the power in two polarizations.

Figure 13:
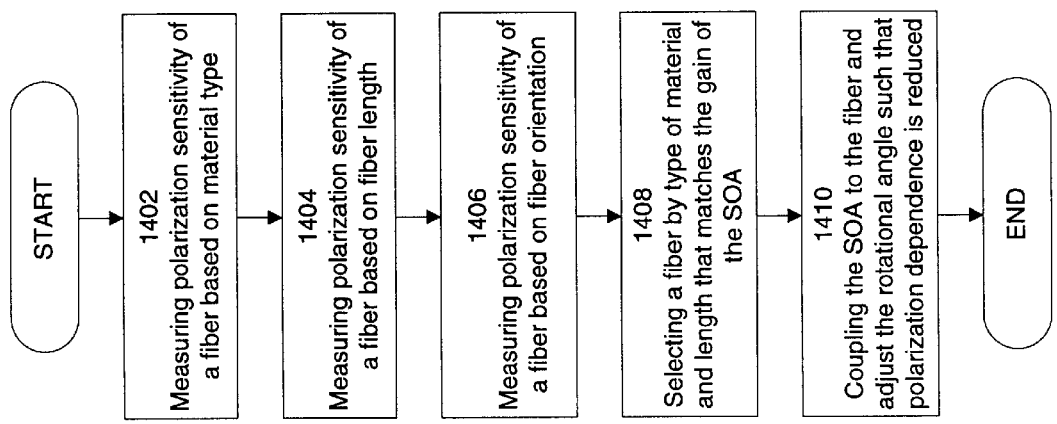
FIG. 13 is a flowchart of one embodiment of a method for manufacturing a polarization insensitive semiconductor optical amplifier.

FIG. 13 is a flowchart of a method for manufacturing a polarization insensitive semiconductor optical amplifier when the PDL unit 206 has a specific embodiment as a piece of fiber. In particular, the measuring step could include several measuring steps such as measuring 1402 the polarization sensitivity of a plurality of fibers based on material type and structure, measuring 1404 the polarization sensitivity of a plurality of fibers based on fiber length, and measuring 1406 the polarization sensitivity of a plurality of fibers based on fiber orientation. Those skilled in the art will recognize that any of the parameters described above with reference to FIG. 10C could be measured to determine the amount of polarization dependent loss variations that those parameters produce. Then one of the plurality of fibers is selected based on the one that provides the polarization dependent loss characteristics that best match the polarization dependent gain characteristics of the SOA 204. Finally, the selected fiber is mounted in the position that produces the best match of loss compared to the SOA 204.

The above description is included to illustrate the operation of the various embodiments of the present invention and is not meant to limit the scope of the invention. The scope of the invention is to be limited only by the following claims. From the above description, many variations will be apparent to one skilled in the art that would yet be encompassed by the spirit and scope of the invention.

What is claimed is:

1. A polarization insensitive semiconductor optical amplifier module, the module comprising:

a semiconductor optical amplifier; and a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit is a polarizing fiber having a pre-defined length; and wherein the semiconductor optical amplifier and the polarization dependent loss unit are packaged together as a module.

2. A polarization insensitive semiconductor optical amplifier module, the module comprising:

a semiconductor optical amplifier; and a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit is a polarizing fiber having a pre-defined rotational position with respect to the semiconductor optical amplifier; and wherein the semiconductor optical amplifier and the polarization dependent loss unit are packaged together as a module.

3. A polarization insensitive semiconductor optical amplifier module, the module comprising:

a semiconductor optical amplifier; and a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit is a parallel metallic strip polarizer having variable broken lines to create variable polarization dependent loss across a filter, and the filter is mounted in a movable position to tune the polarization dependent loss amplitude, and a rotatable position to tune loss to TE/TM; and wherein the semiconductor optical amplifier and the polarization dependent loss unit are packaged together as a module.

4. A polarization insensitive semiconductor optical amplifier module, the module comprising:

a semiconductor optical amplifier; and a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit comprises a first optical fiber and a second optical fiber butt coupled, with an axis of the second optical fiber offset from an axis of the first optical fiber; and wherein the semiconductor optical amplifier and the polarization dependent loss unit are packaged together as a module.

5. A polarization insensitive semiconductor optical amplifier module, the module comprising:
- a semiconductor optical amplifier; and
- a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit comprises an optical fiber bent to a predetermined angle to produce matching polarization dependent loss; and
- wherein the semiconductor optical amplifier and the polarization dependent loss unit are packaged together as a module.

6. A polarization insensitive semiconductor optical amplifier module, the module comprising:
- a semiconductor optical amplifier having an input facet and an output, and having a tilted stripe that is angled with respect to cleave planes of the semiconductor optical amplifier; and
- a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit is a thin film coating on the input facet of the semiconductor optical amplifier, the thin film having a thickness such that the polarization dependent loss is about the same as the polarization dependent gain of the semiconductor optical amplifier; and
- wherein the semiconductor optical amplifier and the polarization dependent loss unit are packaged together as a module.

7. A polarization insensitive semiconductor optical amplifier module, the module comprising:
- a semiconductor optical amplifier having a tilted stripe that is angled with respect to cleave planes of the semiconductor optical amplifier; and
- a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, wherein the polarization dependent loss unit is a thin film coating on an output facet of the semiconductor optical amplifier, the thin film having a thickness such that the polarization dependent loss is about the same as the polarization dependent gain of the semiconductor optical amplifier; and
- wherein the semiconductor optical amplifier and the polarization dependent loss unit are packaged together as a module.

8. The module of claim 7, wherein the thin film is any material used as an anti-reflective coating.

9. The module of claim 7, wherein the thin film is one from the group of aluminum nitride, aluminum oxide, titanium oxide, silicon, silicon oxide, yitrium oxide, zirconium oxide.

10. The module of claim 7, wherein the thin film is a plurality of layers of one or more materials.

11. A polarization insensitive semiconductor optical amplifier module, the module comprising:
- a semiconductor optical amplifier; and
- a polarization dependent loss unit optically coupled to the semiconductor optical amplifier; the polarization dependent loss unit providing loss based on the polarization of light provided to the polarization dependent loss unit, the polarization dependent loss unit having loss that makes the semiconductor optical amplifier module less polarization sensitive, and wherein the polarization dependent loss unit is a fiber positioned such that the axis of the fiber is at a predetermined angle with respect to a axis of an active region of the semiconductor optical amplifier; and
- wherein the semiconductor optical amplifier and the polarization dependent loss unit are packaged together as a module.

12. A method for manufacturing a polarization insensitive semiconductor optical amplifier module, the method comprising the step of:
- determining a polarization dependent gain of a semiconductor optical amplifier;
- determining a polarization dependent loss of at least one polarization dependent loss unit;
- selecting a polarization dependent loss unit that has a polarization dependent loss that reduces the polarization sensitivity of the semiconductor optical amplifier, the selected polarization dependent loss unit being a variable polarization dependent loss unit;
- tuning the loss of the PDL unit to make the semiconductor optical amplifier module polarization insensitive;
- optically coupling the selected polarization dependent loss unit to the semiconductor optical amplifier; and
- packaging the selected polarization dependent loss unit and the semiconductor optical amplifier as a semiconductor optical amplifier module.

13. A method for manufacturing a polarization insensitive semiconductor optical amplifier module, the method comprising the step of:
- determining a polarization dependent gain of a semiconductor optical amplifier;
- determining a polarization dependent loss of at least one polarization dependent loss unit by determining the polarization dependent loss of a plurality of fibers having different lengths;
- selecting a polarization dependent loss unit that has a polarization dependent loss that reduces the polarization sensitivity of the semiconductor optical amplifier;
- optically coupling the selected polarization dependent loss unit to the semiconductor optical amplifier; and
- packaging the selected polarization dependent loss unit and the semiconductor optical amplifier as a semiconductor optical amplifier module.

14. A method for manufacturing a polarization insensitive semiconductor optical amplifier module, the method comprising the step of:
- determining a polarization dependent gain of a semiconductor optical amplifier;
- determining a polarization dependent loss of at least one polarization dependent loss unit by determining the polarization dependent loss of a fiber based on a plurality of rotational orientations;

selecting a polarization dependent loss unit that has a polarization dependent loss that reduces the polarization sensitivity of the semiconductor optical amplifier;

optically coupling the selected polarization dependent loss unit to the semiconductor optical amplifier; and packaging the selected polarization dependent loss unit and the semiconductor optical amplifier as a semiconductor optical amplifier module.

15. A method for manufacturing a polarization insensitive semiconductor optical amplifier module, the method comprising the step of:

determining a polarization dependent gain of a semiconductor optical amplifier;

determining a polarization dependent loss of at least one polarization dependent loss unit by determining the polarization dependent loss of a first fiber and a second fiber at a plurality of offsets from each other;

selecting a polarization dependent loss unit that has a polarization dependent loss that reduces the polarization sensitivity of the semiconductor optical amplifier;

optically coupling the selected polarization dependent loss unit to the semiconductor optical amplifier; and packaging the selected polarization dependent loss unit and the semiconductor optical amplifier as a semiconductor optical amplifier module.

16. A method for manufacturing a polarization insensitive semiconductor optical amplifier module, the method comprising the step of:

determining a polarization dependent gain of a semiconductor optical amplifier;

determining a polarization dependent loss of at least one polarization dependent loss unit by determining the polarization dependent loss of a fiber bent at a plurality of different angles;

selecting a polarization dependent loss unit that has a polarization dependent loss that reduces the polarization sensitivity of the semiconductor optical amplifier;

optically coupling the selected polarization dependent loss unit to the semiconductor optical amplifier; and packaging the selected polarization dependent loss unit and the semiconductor optical amplifier as a semiconductor optical amplifier module.

* * * * *

UNITED STATES PATENT AND TRADEMARK OFFICE
CERTIFICATE OF CORRECTION

PATENT NO. : 6,310,720 B1
DATED : October 30, 2001
INVENTOR(S) : Jeffrey Walker et al.

It is certified that error appears in the above-identified patent and that said Letters Patent is hereby corrected as shown below:

<u>Title page,</u>
ABSTRACT, line 7, please insert "PDL" in front of -- unit --.

Signed and Sealed this

Twenty-sixth Day of March, 2002

Attest:

JAMES E. ROGAN
*Attesting Officer*    *Director of the United States Patent and Trademark Office*

UNITED STATES PATENT AND TRADEMARK OFFICE
CERTIFICATE OF CORRECTION

PATENT NO. : 6,310,720 B2
DATED : October 30, 2001
INVENTOR(S) : Walker et al.

It is certified that error appears in the above-identified patent and that said Letters Patent is hereby corrected as shown below:

Title page,
Item [56], OTHER PUBLICATIONS, "1.5µM Multiquantum" reference, before "U. Koren," delete "and"

Column 1,
Line 10, change "09/09/416,817" to -- 09/416,817 --

Column 5,
Line 4, change "09/09/416,817" to -- 09/416,817 --
Line 8, after "type" change "know" to -- known --
Line 12, change "SOAs" to -- SOA --
Line 54, before "according" remove "to"

Column 6,
Line 7, change "SOA" to -- SOAs --

Column 8,
Line 7, change "angel," to -- angle --

Column 10,
Line 17, change "recognized" to -- recognize --

Signed and Sealed this

Thirtieth Day of March, 2004

JON W. DUDAS
*Acting Director of the United States Patent and Trademark Office*